(12) United States Patent
Liu et al.

(10) Patent No.: US 10,340,578 B2
(45) Date of Patent: Jul. 2, 2019

(54) ELECTRON-NUCLEAR DOUBLE RESONANCE RESONATOR

(71) Applicant: Wuhan Institute of Physics And Mathematics, Chinese Academy of Sciences, Wuhan, Hubei (CN)

(72) Inventors: Chaoyang Liu, Wuhan (CN); Quan Tao, Wuhan (CN); Yugui He, Wuhan (CN)

(73) Assignee: Wuhan Institute of Physics And Mathematics, Chinese Academy of Sciences, Wuhan (CN)

( * ) Notice: Subject to any disclaimer, the term of this patent is extended or adjusted under 35 U.S.C. 154(b) by 93 days.

(21) Appl. No.: 15/621,987

(22) Filed: Jun. 13, 2017

(65) Prior Publication Data
US 2017/0276743 A1    Sep. 28, 2017

Related U.S. Application Data

(63) Continuation of application No. PCT/CN2015/073828, filed on Mar. 7, 2015.

(30) Foreign Application Priority Data

Dec. 19, 2014  (CN) .......................... 2014 1 0796330

(51) Int. Cl.
*H01P 7/00*     (2006.01)
*G01R 33/343*   (2006.01)
(Continued)

(52) U.S. Cl.
CPC .............. *H01P 7/00* (2013.01); *G01R 33/343* (2013.01); *G01R 33/34007* (2013.01);
(Continued)

(58) Field of Classification Search
CPC ............ G01R 33/343; G01R 33/34007; G01R 33/34092; G01R 33/34069;
(Continued)

(56) References Cited

U.S. PATENT DOCUMENTS 4,748,412 A     5/1988   Murakami et al.
4,875,013 A    10/1989   Yamamoto et al.
(Continued)

FOREIGN PATENT DOCUMENTS

CN      102824174 A    12/2012
EP        2680022 A2    1/2004

OTHER PUBLICATIONS

Neudert et al, "An Alderman-Grant resonator for S-Band Dynamic Nuclear Polarization", Journal of Magnetic Resonance, vol. 242, pp. 79-85, 2014.*
(Continued)

*Primary Examiner* — Benny T Lee
*Assistant Examiner* — Hafizur Rahman
(74) *Attorney, Agent, or Firm* — Mei & Mark LLP; Manni Li

(57) ABSTRACT

An electron-nuclear double resonance resonator, having a loop-gap resonator and an elongated lead; the loop-gap resonator comprises a plurality of arc-shaped conductive plates, and the elongated lead connects the arc-shaped conductive plates into a radio-frequency coil; the loop-gap resonator resonates at an electron resonance frequency, and the radio-frequency coil resonates at a nuclear resonance frequency; with the structure of the loop-gap resonator, the separation between an electric field and a magnetic field can be accelerated to ensure the maximization of the ratio of the magnetic field to the electric field inside a resonant resonator; and with the elongated lead, the impact of the lead to a resonance frequency and the mode of the loop-gap resonator
(Continued)

is prevented as much as possible, and meanwhile the conductive plates of the loop-gap resonator can be connected into the radio-frequency coil.

5 Claims, 4 Drawing Sheets

(51) Int. Cl.
G01R 33/34 (2006.01)
G01R 33/60 (2006.01)
G01R 33/62 (2006.01)
G01R 33/36 (2006.01)
G01R 33/28 (2006.01)

(52) U.S. Cl.
CPC . *G01R 33/34069* (2013.01); *G01R 33/34092* (2013.01); *G01R 33/3635* (2013.01); *G01R 33/60* (2013.01); *G01R 33/62* (2013.01); *G01R 33/282* (2013.01)

(58) Field of Classification Search
CPC .... G01R 33/2635; G01R 33/60; G01R 33/62; G01R 33/282; H01P 7/00
USPC .......................................................... 333/219
See application file for complete search history.

(56) References Cited

U.S. PATENT DOCUMENTS

2004/0113617 A1 6/2004 De Swiet et al.
2015/0022209 A1* 1/2015 Halpern ................ A61B 5/055
324/318

OTHER PUBLICATIONS

Rinard et al., "Chapter 2, Loop-Gap Resonators", pp. 20, lines 4-5 of Biological Magnetic Resonance, vol. 24, Kluwer Academic/Plenum Publishers, 2005.*

* cited by examiner

ELECTRON-NUCLEAR DOUBLE RESONANCE RESONATOR

CROSS-REFERENCE TO RELATED APPLICATIONS

The subject application is a continuation of PCT/CN2015/073828 filed on Mar. 7, 2015 and claims priority on Chinese application no. 201410796330.6 filed on Dec. 19, 2014. The contents and subject matter of the PCT and Chinese priority application are incorporated herein by reference.

TECHNICAL FIELD

The present invention pertains to magnetic resonance, particularly, an electron-nuclear double resonance resonator.

BACKGROUND OF INVENTION AND DESCRIPTION OF RELATED ART

As an important means for the study of molecular structures, intermolecular interactions and the like, nuclear magnetic resonance (NMR), has been widely applied to the material sciences, physics, chemistry, biology, and medical science. However, NMR is fundamentally limited in sensitivity. Dynamic nuclear polarization (DNP) technology based on electron-nuclear polarization transfer provides an important approach to the enhancement of the NMR. DNP is an electron-nuclear double resonance technology, where electron spin is controlled with microwave to transfer the high spin polarization of unpaired electrons (free radicals) to a nucleus for enhancing the spin polarization of the nucleus. Since the gyromagnetic ratio (or polarization) of the electron is 660 times (2600 times for $^{13}C$) that of proton, the maximal DNP enhancement of the proton is 660 times (2600 times for $^{13}C$) if the polarization of the electron is completely transferred to a corresponding nucleus.

An electron-nuclear double resonance system typically includes three magnetic fields, with one being a main magnetic field $B_0$, and the other two being a radio-frequency field $B_1$ generated by a radio-frequency coil and a microwave field $B_2$ generated by a microwave resonator respectively. $B_1$ is used for exciting nuclear magnetic resonance, and $B_2$ is used for exciting electron spin resonance.

The double resonance resonator is an important component of the dynamic nuclear polarization spectrometer. Traditional metallic resonant cavity has been widely used due to its high Q value. However, the high Q value of the traditional metallic resonant cavity is not suitable for the excitation of a pulse microwave, and meanwhile, the traditional metallic resonant cavity can't be used for a liquid sample having a high dielectric constant due to large size and poor fill factor and poor distribution of a microwave magnetic field. Although certain problems can be solved by a newly developed loop-gap resonator, the radio-frequency coil taking the form of a solenoid is generally placed outside the loop-gap resonator, and meanwhile, it plays the role of shielding the loop-gap resonator. To reduce the shielding effect of the loop-gap resonator on the radio-frequency field, the loop-gap resonator is generally manufactured by performing silver plating on a quartz glass surface. Since the radio-frequency coil is required to play the role of shielding the loop-gap resonator, it is desired that the diameter of the radio-frequency coil be more than 2 times that of the loop-gap resonator to obtain a microwave resonance mode as desired, i.e., a better field distribution, thereby greatly reducing the fill factor of the radio-frequency coil. According to theoretical deduction, the detection sensitivity of a system is in direct proportion to the fill factor of the coil, and the practice above will greatly reduce the detection sensitivity of the system.

SUMMARY OF THE INVENTION

To overcome existing defects in the technical solutions in the current technology and to improve the detection sensitivity of the system, the present invention provides a solution for combining the radio-frequency coil and the microwave resonator into a whole by changing the double loop-gap resonator in tradition into multiple loop-gap resonators, and then connecting the conductors of the loop-gap resonator into a radio-frequency coil with an elongated lead.

An objective of the present invention is to provide an electron-nuclear double resonance resonator to combine a radio-frequency coil and a microwave resonator into an integral structure for eliminating the shielding effect of a loop-gap resonator on a radio-frequency field. More importantly, the present invention reduces the diameter of the radio-frequency coil to be the same as the loop-gap resonator for increasing the fill factor of the radio-frequency coil and improving the detection sensitivity of a system. Meanwhile, the structure of such resonator may greatly improve the distribution of a microwave magnetic field, and is more suitable for the excitation of a pulse microwave compared with a traditional metallic resonator.

The present invention provides an electron-nuclear double resonance resonator, comprising a plurality of arc-shaped conductive plates; the respective arc-shaped conductive plates are distributed circumferentially to form a cylindrical loop-gap resonator; the loop-gap resonator is provided with two opposing radio-frequency coil windows; each radio-frequency coil window is formed by recesses at the side edges of the two adjacent arc-shaped conductive plates; the respective arc-shaped conductive plates are connected into a radio-frequency coil via a lead; and a radio-frequency magnetic field generated by the radio-frequency coil passes through the two radio-frequency coil windows in turn.

In the present invention, the two radio-frequency coil windows are distributed symmetrically with respect to an axial center of the loop-gap resonator.

In the present invention, the number of the arc-shaped conductive plates is 2n, with n being a natural number more than 1.

In the present invention, the radio-frequency coil is a saddle coil.

In the present invention, the electron-nuclear double resonance resonator may further comprise a microwave coupling loop disposed in the loop-gap resonator; two terminals of the radio-frequency coil are connected with a tuning capacitor in parallel; one end of the tuning capacitor is connected with a matching capacitor; the other end of the matching capacitor forms one end of a radio-frequency interface; and the other end of the tuning capacitor forms the other end of the radio-frequency interface.

By combining the radio-frequency coil and the microwave resonator into a whole according to the resonator of the present invention, the structural size of the electron-nuclear double resonance resonator is greatly reduced, the fill factor of the radio-frequency coil is increased, and the detection sensitivity of the system is improved.

Figure 1:
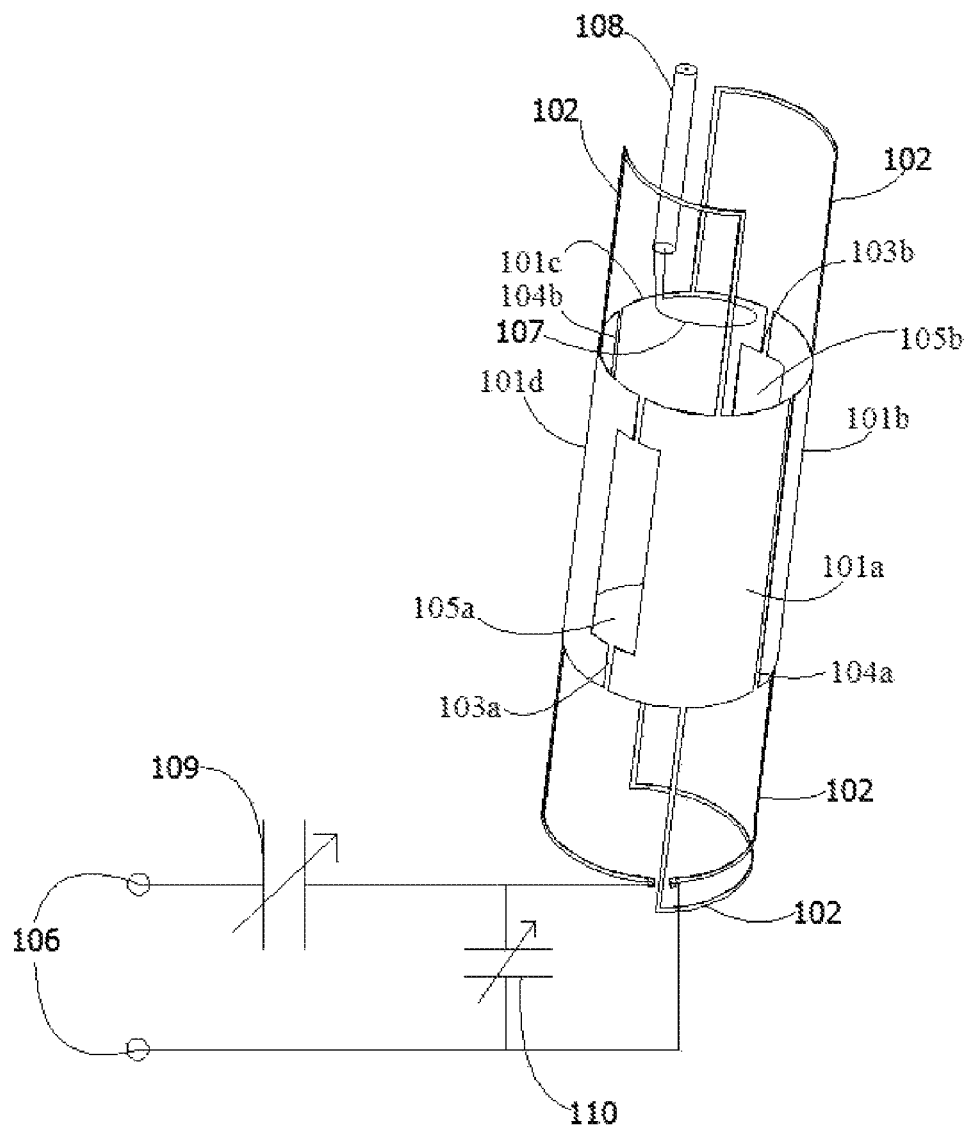
FIG. 1 is a structural diagram of a resonator of the present invention, with n=2 as an example.

Reference numbers are used as follows:

101a: first arc-shaped conductive plate; 101b: second arc-shaped conductive plate; 101c: third arc-shaped conductive plate; 101d: fourth arc-shaped conductive plate; 102: elongated lead; 103a: first H-portion interval; 103b: second H-portion interval; 104a: first linear interval; 104b: second linear interval; 105a: first radio-frequency coil window; 105b: second radio-frequency coil window; 106: radio-frequency interface; 107: microwave coupling loop; 108: coaxial line; 109: matching capacitor; and 110: tuning capacitor.

200: double resonance resonator as described above; 201: magnet system; 202: radio-frequency transreceiver switch; 203: radio-frequency preamplifier module; 204: radio-frequency power amplifier; 205: radio-frequency transmitter module; 206: receiver module; 207: microwave power amplifier; 208: microwave transmitter module; 209: master control board module; 210: network switch; and 211: service computer.

DETAILED DESCRIPTION OF THE INVENTION AND EMBODIMENTS

The present invention will be further described below in combination with accompanying drawings and embodiments.

In a first embodiment of the present invention, an electron-nuclear double resonance resonator comprises a plurality of arc-shaped conductive plates; the respective arc-shaped conductive plates are distributed circumferentially to form a cylindrical loop-gap resonator; the loop-gap resonator is provided with two opposing radio-frequency coil windows; each radio-frequency coil window is formed by recesses at the side edges of two adjacent arc-shaped conductive plates; the respective arc-shaped conductive plates are connected into a radio-frequency coil via a lead; and a radio-frequency magnetic field generated by the radio-frequency coil passes through the two radio-frequency coil windows in turn. The two radio-frequency coil windows are distributed symmetrically with respect to an axial center of the loop-gap resonator. The number of the arc-shaped conductive plates is 2n, with n>1. A saddle coil may be selected as the radio-frequency coil.

Preferably, an interval between side edges of two adjacent arc-shaped conductive plates is 0.02 to 0.2 times the diameter of the loop-gap resonator. Each radio-frequency coil window has a height being 1 to 1.2 times the diameter of the loop-gap resonator and has a width being 0.25 to 0.3 times the diameter of the loop-gap resonator.

The electron-nuclear double resonance resonator further comprises a microwave coupling loop disposed in the loop-gap resonator; two terminals of the radio-frequency coil are connected with a tuning capacitor in parallel; one end of the tuning capacitor is connected with one end of a matching capacitor; the other end of the matching capacitor forms one end of a radio-frequency interface; and the other end of the tuning capacitor forms the other end of the radio-frequency interface.

In a second embodiment of the present invention, in case of n=2, an electron-nuclear double resonance resonator comprises a loop-gap resonator and an elongated lead connecting the loop-gap resonator; in case of n=2, the loop-gap resonator comprises a first arc-shaped conductive plate 101a, a second arc-shaped conductive plate 101b, a third arc-shaped conductive plate 101c, and a fourth arc-shaped conductive plate 101d; the first arc-shaped conductive plate 101a and the second arc-shape conductive plate 101b form a first H-shaped conductive plate, and an interval between the first arc-shaped conductive plate 101a and the second arc-shaped conductive plate 101b is a first linear interval 104a; the third arc-shaped conductive plate 101c and the fourth arc-shaped conductive plate 101d form a second H-shaped conductive plate, and an interval between the third arc-shaped conductive plate 101c and the fourth arc-shaped conductive plate 101d is a second linear interval 104b; the first H-shaped conductive plate and the second H-shaped conductive plate form the cylindrical loop-gap resonator; convex portions of H shapes at two sides of the first H-shaped conductive plate and the second H-shaped conductive plate form an H-portion interval; and concave portions of H shapes at two sides of the first H-shaped conductive plate and the second H-shaped conductive plate form a first radio-frequency coil window 105a and a second radio-frequency coil window 105b, i.e., the concave portions of the H shapes of the first arc-shaped conductive plate 101a and the fourth arc-shaped conductive plate 101d form a first radio-frequency coil window 105a, and the concave portions of the H shapes of the second arc-shaped conductive plate 101b and the third arc-shaped conductive plate 101c form a second radio-frequency coil window 105b. The lead connects the fourth arc-shaped conductive plate 101d, the first arc-shaped conductive plate 101a, the third arc-shaped conductive plate 101c, the second arc-shaped conductive plate 101b in series in turn, i.e. the fourth arc-shaped conductive plate 101d and the first arc-shaped conductive plate 101a are connected at the same terminal through the lead, the first arc-shaped conductive plate 101a and third arc-shaped conductive plate 101c are connected at the same terminal through the lead, the third arc-shaped conductive plate 101c and the second arc-shaped conductive plate 101b are connected at the same terminal through the lead, the fourth arc-shaped conductive plate 101d and the second arc-shaped conductive plate 101b are connected with the resonance module through the lead respectively, and one end of the cylindrical loop-gap resonator is provided with a microwave coupling loop 107. The first arc-shaped conductive plate 101a to the fourth arc-shaped conductive plate 101d and the lead connected therewith form a saddle-shaped radio-frequency coil.

When a radio-frequency signal is transferred to the radio-frequency interface 106, a magnetic field generated by a loop formed by connecting the fourth arc-shape conductive plate 101d and the first arc-shaped conductive plate 101a via the lead and a magnetic field generated by a loop formed by connecting the third arc-shaped conductive plate 101c and the second arc-shaped conductive plate 101b via the lead are the same in their direction, i.e. the first radio-frequency coil window 105a and the second radio-frequency coil window 105b are the same in the direction of the magnetic field. As such, a uniform magnetic field with a certain intensity can be formed in the center of the coil to excite a sample placed in the center of the coil for nuclear magnetic resonance. For the loop-gap resonator having a defined size formed by the first arc-shaped conductive plate 101a, the second arc-shaped conductive plate 101b, the third arc-shaped conductive plate 101c and the fourth arc-shaped conductive plate 101d, a magnetic field along an axial direction of the loop-gap resonator will be formed in the loop-gap resonator by coupling a microwave signal entering the resonator through a coupling loop, and uniformly distributed in a center sample area. As such, unpaired electrons in the sample can be excited for electron paramagnetic resonance.

The cylindrical loop-gap resonator resonates at an electron resonance frequency of a higher frequency value, for example, the electron resonance frequency is about 9.8 GHz in case of a magnetic field of 0.35 T.

The radio-frequency coil formed by connecting the first arc-shaped conductive plate 101a, the second arc-shaped conductive plate 101b, the third arc-shaped conductive plate 101c and the fourth arc-shaped conductive plate 101d via the elongated lead 102 resonates at a nuclear resonance frequency of a lower frequency value, for example, a hydrogen nucleus resonance frequency is about 14.9 MHz in case of a magnetic field of 0.35 T.

The interval among the arc-shaped conductive plates (103a, 103b, 104a, 104b) ranges from 0.2 mm to 0.5 mm in case of a magnet of 0.35 T so as to guarantee the uniformity and resonance mode of a microwave field thereof.

The microwave signal of the loop-gap resonator can be excited with the coupling loop, which is coaxial with the loop-gap resonator.

It is required that the radio-frequency coil windows (105a, 105b) be sized properly to take both the uniformity of the radio-frequency field and the uniformity of the microwave field into consideration, and in case of a magnet of 0.35 T, the height of the window is 1 to 1.2 times the diameter of the loop-gap resonator, and the width of the window is 0.25 to 0.3 times the diameter of the loop-gap resonator.

As shown in FIG. 1, the electron-nuclear double resonance resonator also comprises a radio-frequency interface 106, a matching capacitor 109, a tuning capacitor 110, a microwave coupling loop 107, and a microwave transmission coaxial line 108; and the tuning capacitor 110 tunes the radio-frequency coil to the nuclear resonance frequency, and the matching capacitor 109 enables the radio-frequency coil to be matched at an optimal state. A distance between the microwave coupling loop 107 and the loop-gap resonator is regulated to achieve an optimal coupling effect between the microwave coupling loop and the loop-gap resonator.

When the electron-nuclear double resonance resonator is applied to a magnet having a magnetic field intensity of 0.35 T, the hydrogen nucleus resonance frequency is about 14.9 MHz and the electron resonance frequency is about 9.8 GHz, in case of the magnetic field intensity of 0.35 T. A similar structure may also be used on other magnetic field intensities with different resonance frequency, the microwave resonance frequency can be changed as long as the interval among the arc-shaped conductive plates (103a, 103b, 104a, 104b) and the diameter of the loop-gap resonator are regulated, and the resonance frequency of the radio-frequency coil can be regulated through the tuning capacitor 110.

When in normal work, a high-power radio-frequency signal is transmitted to the radio-frequency coil through the radio-frequency interface 106 for exciting a nuclear magnetic resonance signal in the sample, and an obtained free induction decay (FID) signal is transmitted to a receiver side through the radio-frequency interface 106. Meanwhile, the high-power microwave signal is coupled to the interior of the loop-gap resonator through the coaxial line 108 for exciting an electron paramagnetic work signal.

Figure 2A:
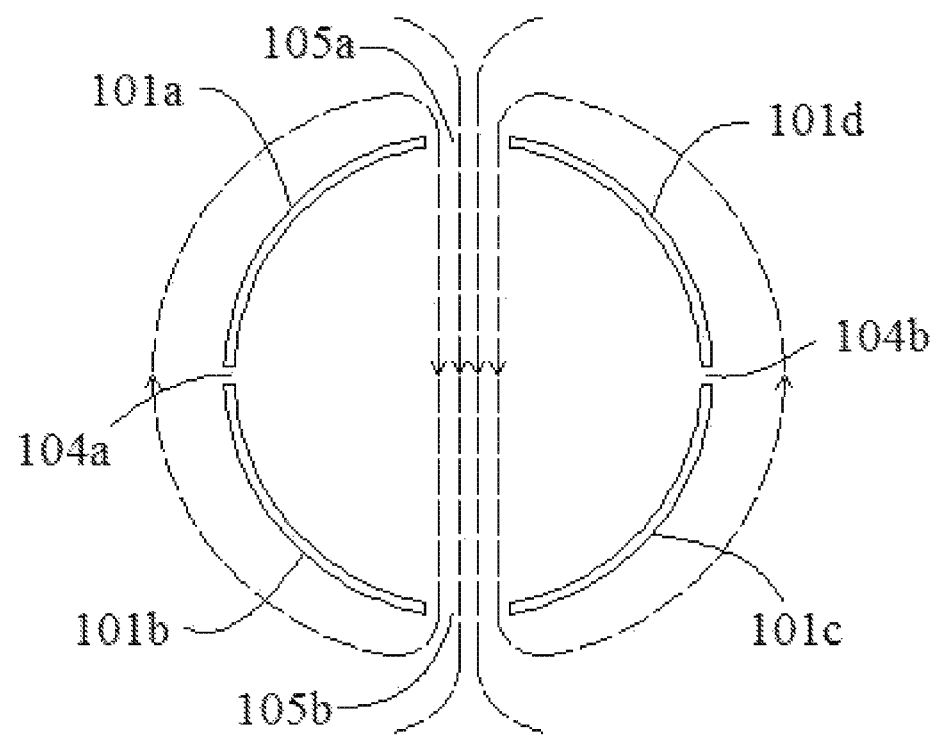
FIG. 2(a) is a diagram showing a cross section of the resonator shown in FIG. 1, where a dashed line represents the distribution of magnetic lines of force of a radio-frequency field.
Figure 2B:
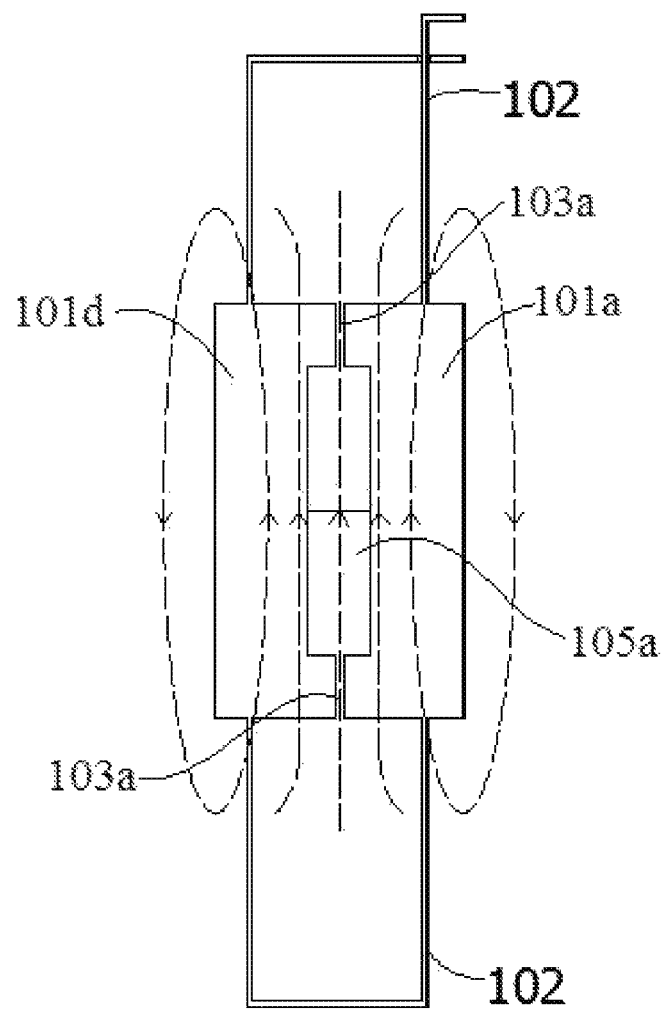
FIG. 2(b) is a diagram showing an axial section of the resonator shown in FIG. 1, where a dashed line represents the distribution of magnetic lines of force of a microwave field.

FIGS. 2(a) and 2(b) are diagrams showing the distributions of magnetic lines of force of a radio-frequency field and a microwave field respectively when the above resonator is tuned to the nuclear resonance frequency and the electron resonance frequency.

The radio-frequency coil is fixed in a shielding cavity with a crosslinked polystyrene support, the coaxial line connecting the microwave coupling loop 107 is movable up and down along an axial direction of the resonator within a certain range to thereby regulate the coupling state between the microwave coupling loop 107 and the loop-gap resonator.

Figure 3:
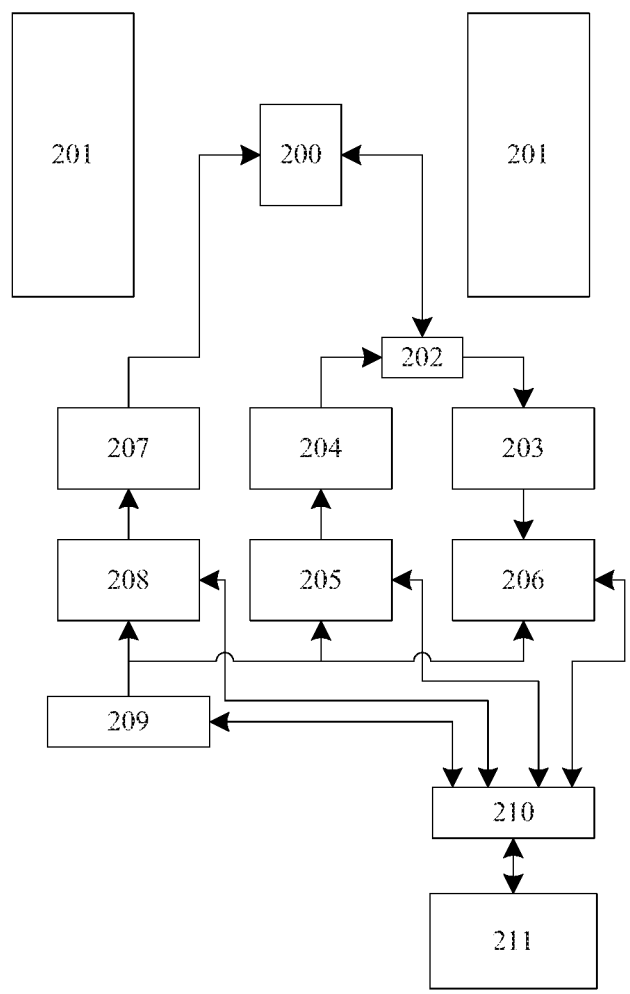
FIG. 3 is a schematic diagram of a dynamic nuclear polarization (DNP) system where the resonator of the present invention is used for enhancing the signal of nuclear magnetic resonance.

FIG. 3 is a schematic diagram of a system where the electron-nuclear double resonance resonator is used in a dynamic nuclear polarization system. A service computer 211 acting as a control portion of the whole system comprises a host, a display, a keyboard and a mouse.

The whole system is controlled by the service computer 211, which communicates with other modules, including a radio-frequency transmitter module 205, a microwave transmitter module 208, a receiver module 206 and a master control board module 209, through a network switch 210. The radio-frequency transmitter module 205 mainly generates a radio-frequency pulse with rapid switching of amplitude, phase and frequency for exciting nuclear magnetic resonance. The microwave transmitter module 208 mainly generates a microwave pulse with rapid switching of amplitude, phase and frequency for exciting electron spin resonance. The receiver module 206 is mainly used for receiving a free induction decay signal generated through nuclear magnetic resonance and amplifying, sampling and down-converting of the signal. The master control board module 209 is responsible for the startup and synchronization of the whole system. In one particular experiment, a user sends a corresponding pulse sequence to the radio-frequency transmitter module 205, the receiver module 206, the microwave transmitter module 208 and the master control board module 209 through the service computer 211, and the master control board module 209 obtains a control signal to control the microwave transmitter module 208, the radio-frequency transmitter module 205 and the receiver module 206 by analyzing the pulse sequence. In an transmitting phase, the radio-frequency transmitter module 205 transmits the radio-frequency signal obtained through analyzing the RF pulse sequence elements to a radio-frequency power amplifier 204 for power amplification, and then the amplified radio-frequency signal is selected by a radio-frequency transreceiver switch 202 and transmitted to a radio-frequency input terminal of a double resonance resonator 200 for exciting the nuclear magnetic resonance. The microwave transmitter module 208 transmits the microwave signal obtained through analyzing the microwave pulse sequence elements to the microwave power amplifier 207 for power amplification, and the amplified microwave signal is transmitted to a microwave input terminal of the double resonance resonator 200 for exciting an electron spin resonance. In a receiving phase, the radio-frequency transreceiver switch 202 transmits the obtained FID signal to the radio-frequency preamplifier module 203 to amplify and down-convert the signal on the preamplifier and then transmits the signal into the receiver module 206, which performs digital sampling and digital quadrature down-conversion to fulfill an accumulation function according to a predetermined manner and uploads the FID signal to the service computer 211 through the network switch 210 for observation and further processing by experimental technicians. The magnet system 201 provides a stable and uniform static magnetic field to the whole system.

With the skillful use of the elongated lead to combine the loop-gap resonator and the radio-frequency coil into a whole, the present invention greatly simplifies the structure of the electron-nuclear double resonance resonator while ensuring the efficiency of the two resonance modes.

The particular embodiments described herein are only for the purpose of illustrating the spirit of the present invention. Those skilled in the art to which the present invention pertains may make a variety of modifications or supplementations or substitutions in a similar way to the particular embodiments as described, which shall be deemed as not departing from the spirit of the present invention or not going beyond the scope defined by the accompanying claims.

We claim:

1. An electron-nuclear double resonance resonator, comprising
    a plurality of pairs of arc-shaped conductive plates, each of the arc-shaped conductive plates having side edges and being circumferentially distributed, two pairs of the arc-shaped conductive plates opposing each other and in each pair of the two pairs, the arc-shaped conductive plates facing each other with a recess on the adjacent side edge, and the recesses of the pairs of the arc-shaped conductive plates forming two radio-frequency coil windows, the plurality of the pairs of the arc-shaped conductive plates forming a cylindrical loop-gap resonator with the two radio-frequency coil windows, and the two radio-frequency coil windows being provided on the cylindrical loop-gap resonator opposing each other,
    a lead connecting each of the arc-shaped conductive plates in series in turn to form a radio frequency coil that is a saddle-shaped coil having a same diameter as the cylindrical loop-gap resonator,
    wherein
    the radio-frequency coil generates a radio-frequency magnetic field that passes through the two radio-frequency coil windows in turn.

2. The electron-nuclear double resonance resonator according to claim 1, wherein the two radio-frequency coil windows are distributed symmetrically with respect to an axial center of the loop-gap resonator.

3. The electron-nuclear double resonance resonator according to claim 1, wherein a number of the arc-shaped conductive plates is 2 times n, and n is an integer that is 2 or more.

4. The electron-nuclear double resonance resonator according to claim 1, further comprising
    a microwave coupling loop disposed in the loop-gap resonator and being coaxial with the loop-gap resonator,
    wherein a distance between the microwave coupling loop and the loop gap resonator is regulated to adjust coupling effect between the microwave coupling loop and the loop-gap resonator.

5. The electron-nuclear double resonance resonator according to claim 1, further comprising
    a tuning capacitor being connected to two terminals of the radio-frequency coil in parallel,
    a matching capacitor having one end being connected to one end of the tuning capacitor and the other end forming one end of a radio-frequency interface, and the other end of the tuning capacitor forming the other end of the radio-frequency interface.

* * * * *